United States Patent
Miller et al.

[11] Patent Number: 6,095,175
[45] Date of Patent: Aug. 1, 2000

[54] CLAD PIEZOELECTRIC VALVE ACTUATOR AND APPLICATION OF SAME IN CONTROLLING HIGHLY REACTIVE AND CORROSIVE GASES

[75] Inventors: Charles E. Miller, Boulder; Louis T. Yoshida; Michael Steinbach, both of Longmont, all of Colo.

[73] Assignee: Engineering Measurements Company, Longmont, Colo.

[21] Appl. No.: 09/021,792

[22] Filed: Feb. 11, 1998

Related U.S. Application Data

[63] Continuation-in-part of application No. 08/799,304, Feb. 11, 1997.

[51] Int. Cl.$^7$ .................................................. F16K 31/02
[52] U.S. Cl. ............................ 137/15.18; 137/487.5; 251/129.05; 251/129.06
[58] Field of Search ........................... 137/82, 83, 487.5, 137/15.18; 251/129.05, 129.06, 129.14

[56] References Cited

U.S. PATENT DOCUMENTS

| | | | |
|---|---|---|---|
| 3,820,556 | 6/1974 | Millar et al. | 137/220 |
| 3,875,955 | 4/1975 | Gallatin et al. | 137/14 |
| 4,146,051 | 3/1979 | Sparks | 137/486 |
| 4,341,107 | 7/1982 | Blair et al. | 73/3 |
| 4,437,489 | 3/1984 | Casale | 137/487.5 |
| 4,483,376 | 11/1984 | Bresie et al. | 141/95 |
| 4,527,600 | 7/1985 | Fisher et al. | 141/4 |
| 4,590,791 | 5/1986 | Reed et al. | 73/4 R |
| 4,617,952 | 10/1986 | Fujiwara et al. | 137/85 |
| 4,646,940 | 3/1987 | Kramer et al. | 222/1 |
| 4,699,012 | 10/1987 | Lew et al. | 73/861.24 |
| 4,794,947 | 1/1989 | Kuramochi | 137/486 |
| 4,799,169 | 1/1989 | Mims | 364/510 |
| 4,934,401 | 6/1990 | Ikehata et al. | 137/82 |
| 5,029,622 | 7/1991 | Mutter | 141/4 |
| 5,146,941 | 9/1992 | Statler | 137/8 |
| 5,203,537 | 4/1993 | Jacobs et al. | 251/129.06 |
| 5,207,089 | 5/1993 | Abt et al. | 73/37.5 |
| 5,238,030 | 8/1993 | Miller et al. | 141/4 |
| 5,259,424 | 11/1993 | Miller et al. | 141/4 |
| 5,322,260 | 6/1994 | Forbes et al. | 251/129.14 |
| 5,388,984 | 2/1995 | Meslif | 431/12 |
| 5,593,134 | 1/1997 | Steber et al. | 251/129.17 |

*Primary Examiner*—John Rivell
*Attorney, Agent, or Firm*—Chrisman, Bynum & Johnson; James R. Young

[57] ABSTRACT

A micro-mass flow controller (10) has a sonic choked flow restriction (28) with an oscillatable valve (26) for repetitiously opening and closing the sonic choked flow restriction (28) in a time-modulated sequence to set or vary mass flow rate of gas through the sonic choked flow restriction (28) over a period of time to something between no flow and maximum mass flow rate. A bimorph piezoelectric actuator (40) is coated in a sputtered dielectric layer (78) and then encapsulated in stainless steel or other metal cladding (80). A closure member (46) on the actuator (40) is registered to a valve seat (70) by actuating the actuator (40) to force the closure member (46) in a puddle of adhesive (86) against the valve seat (70) until the adhesive (86) cures.

52 Claims, 13 Drawing Sheets

CLAD PIEZOELECTRIC VALVE ACTUATOR AND APPLICATION OF SAME IN CONTROLLING HIGHLY REACTIVE AND CORROSIVE GASES

CROSS REFERENCE TO RELATED PATENT APPLICATION

This patent application is a continuation-in-part of copending U.S. patent application Ser. No. 08/799,304, filed in the U.S. Patent and Trademark Office on Feb. 11, 1997.

BACKGROUND OF THE INVENTION

Field of the Invention

This invention is generally related to fluid flow controllers and more specifically to mass flow controllers for gas flowing at very low rates and at low pressures.

State of the Prior Art

There are many flow controllers, including mass flow controllers, of myriad designs and operating principles for measuring flowing gases. However, current flow control technologies for very low gas flow rates leave much to be desired in accuracy, reliability, and durability, even though the need for such very low rate flow controllers for gases is increasing. In the semiconductor industry, for example, very precise flows of feed gases are flowed into reaction furnaces that usually operate in a vacuum, where thin films of materials are deposited on substrates to form semiconductor devices.

The most common mass flow controller technology that is used currently in the semiconductor industry for controlling feed gases is a variable orifice in combination with a flow restricter and a bypass around the flow restriction, a heater in the bypass, and a thermocouple in the bypass downstream from the heater. The heater imparts thermal energy to the gas that flows through the bypass, and the gas carries the thermal energy to the thermocouple, which heats the thermocouple and causes it to produce voltages that are indicative of the temperature of the thermocouple. The more the variable orifice is opened, the more gas will flow through the bypass, the more heat will be carried by the gas from the heater to the thermocouple, the higher the resulting thermocouple temperature, and the higher the voltage will be across the thermocouple. The thermocouple voltage is measured and processed in instrumentation to indicate the flow rate of the gas and to adjust and maintain the variable orifice at openings required for desired gas flow rates.

Such current flow controller systems suffer from reliability problems, slow response times, and limited dynamic ranges. Reliability problems are due in large part to hard failures, such as clogging, and to soft failures, such as excessive drift, which requires frequent recalibrations in the instrumentation. Such failures cause substantial down time and resulting decrease in yields of semiconductor devices from the reaction furnaces. The control problems result from slow response of the thermocouples to changes in flow rates, usually about one second, thus slow feedback of opening or closing signals to the variable orifices and resulting overshoots and undershoots of orifices required for particular gas flow rates. Operating pressures in ranges of 20–25 p.s.i. are required to maintain repeatability and linearity of flow rate measurements and control, and even then, linearity and repeatability of ±1% and usually more like ±6% is about all that can be expected with this technology. Dynamic range of such controllers, which is also known as turndown ratio (the ratio of maximum measurable flow rate or maximum set point of the valve to its minimum measurable flow rate or minimum set point), is limited to about 100:1.

More accurate and reliable mass flow controllers for feed gases in the semiconductor industry could not only increase quality controls and resulting semiconductor device quality, but could also decrease down time for recalibrating and cleaning, increase gas utilization, and increase yields. Larger dynamic ranges would accommodate more options, uses, and versatility of facilities and gas flows for different depositions and device compositions. More accurate and reproducible gas flow controls, better reliability, and larger dynamic ranges are also needed for many other applications as well.

SUMMARY OF THE INVENTION

Accordingly, it is a general object of the present invention to provide an improved flow controller for very low gas flow rates.

A more specific object of this invention is to provide a gas flow controller that is more accurate and more reliable at very low flow rates than currently available flow controller technologies.

It is also a more specific object of this invention to provide a gas flow controller with a larger dynamic range or turndown for very low flow rates than currently available flow technologies.

Another object of this invention is to provide a flow controller for very low flow rate gas flows that is accurate enough to also be useful for metering as well as controlling very low gas flow rates.

Another specific object of this invention is to provide a very accurate flow controller for controlling very low gas flow rates of exotic gases, such as fluorine and other halogens and very reactive or corrosive gases.

Additional objects, advantages, and novel features of the invention shall be set forth in part in the description that follows, and in part will become apparent to those skilled in the art upon examination of the following description or may be learned by the practice of the invention. The objects and the advantages may be realized and attained by means of the instrumentalities and in combinations particularly pointed out in the appended claims.

To achieve the foregoing and other objects and in accordance with the purposes of the present invention, as embodied and broadly described herein, the micro mass flow controller of the present invention may comprise a sonic choked flow restriction with an oscillateable valve for repetitiously opening and closing the flow restriction in a time-modulated sequence to set or vary mass flow rate of gas through the sonic choked flow restriction over a period of time to something between no flow and maximum mass flow rate. A bimorph piezoelectric actuator is coated in a dielectric layer and then encapsulated in stainless steel or other metal cladding. A closure member on the actuator is registered to a valve seat by actuating the actuator to force the closure member in a puddle of adhesive against the valve seat until the adhesive cures.

To achieve the foregoing and other objects and in accordance with the purposes of the present invention, as embodied and broadly described herein, the method of this invention includes sequentially starting and stopping sonic choked flow of a fluid through a flow restricter in a time-modulated oscillatory manner to impose a duty cycle on the valve that is the ratio of open time to total time, where total time is the sum of the open time and the closed time.

BRIEF DESCRIPTION OF THE DRAWINGS

The accompanying drawings, which are incorporated in and form a part of the specification, illustrate the preferred embodiments of the present invention, and together with the descriptions serve to explain the principles of the invention.

In the Drawings.

DETAILED DESCRIPTION OF THE PREFERRED EMBODIMENTS

Figure 1:
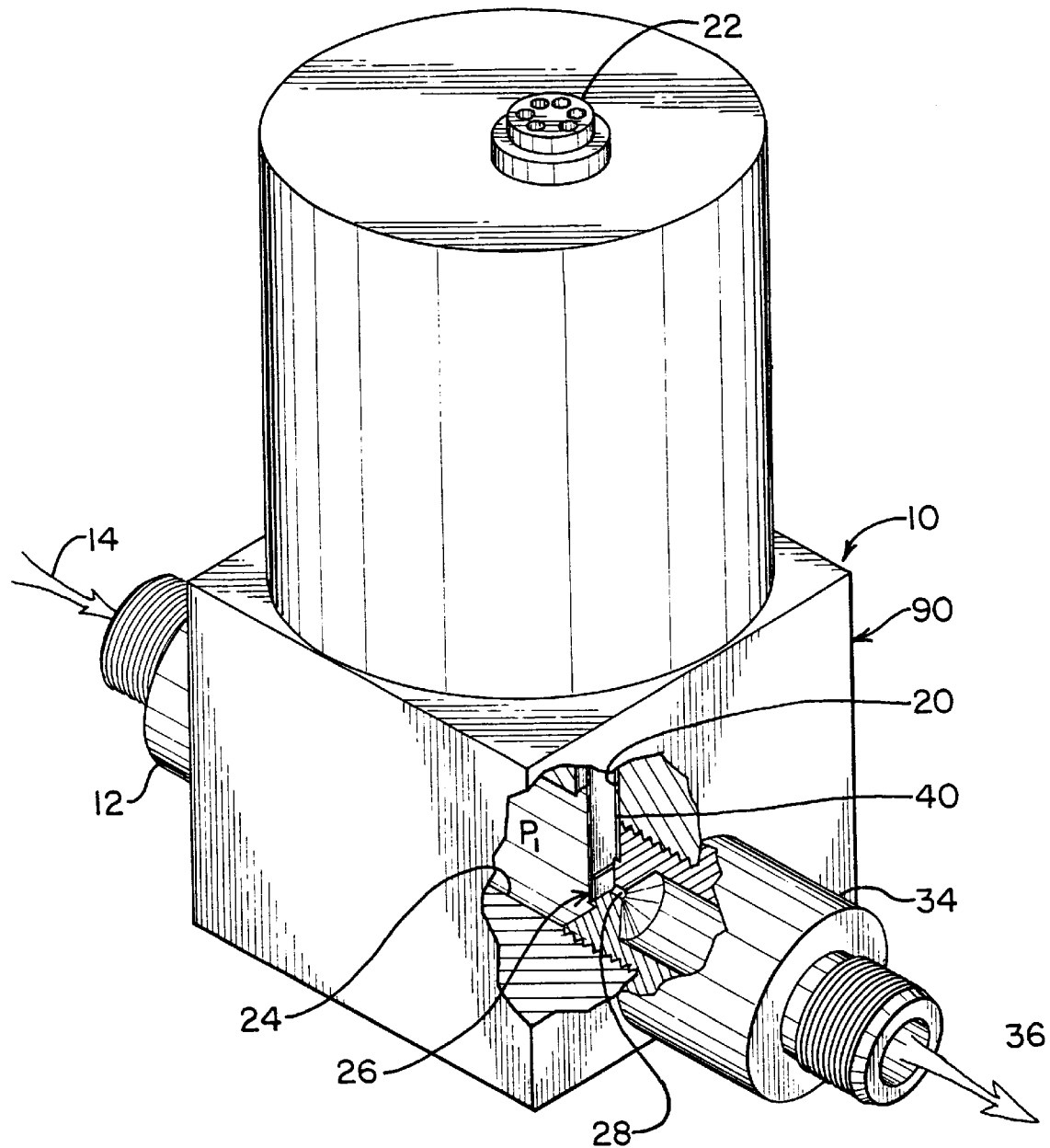
FIG. 1 is an isometric view of a micro mass flow controller of the present invention with a portion of the valve body cut away to reveal internal valve actuator, valve seat, sonic nozzle, and other controller components.

A micro mass flow controller 10 according to the present invention suitable for controlling and metering very small flows of gas at very low pressures is shown in FIG. 1 with a portion of the flow controller body cut away to reveal valve, valve seat, sonic orifice, and other controller components, as will be described in more detail below. However, for an overview, gas from a supply source, not shown, flows into the controller 10 through an inlet connector 12, as indicated by arrow 14, into an inlet plenum 24. From the inlet plenum 24, the gas flows through a control valve 26 into an orifice 28, where it is choked at sonic velocity before flowing through an outlet fitting 34, as indicated by arrow 36.

When the gas flow through the orifice 28 is choked at sonic velocity, the mass flow rate m of the gas is directly proportional to a ratio of the pressure $P_1$ in the inlet plenum 24 to the square root of the temperature $T_1$ of the gas. Specifically, the mass flow rate m can be determined by the equation:

$$\dot{m} = \frac{P_1 C^* A}{\sqrt{T_1}} \tag{1}$$

where:

$P_1$=absolute pressure in inlet plenum 24;

$C^*$=a correction factor that depends on the type of gas;

A=cross-sectional area of the orifice 28; and $T_1$=absolute temperature (Kelvins) of the gas in the inlet plenum 24. Since the area A of the orifice is fixed and can be determined by simple measurement of the orifice diameter D and geometrical calculation ($A=\pi D^2/4$), and the correction factor $C^*$ can be determined empirically for any particular gas, the only dynamic measurements needed to calculate mass flow rate m of the gas according to equation (1) above are inlet plenum pressure $P_1$ and temperature $T_1$ which are relatively simple measurements to make on a real time basis, as is well-known by persons skilled in this art. Therefore, determining instantaneous mass flow rate m of the gas flowing through the sonic choked orifice 28 at any instant of time according to equation (1) is quite straight forward.

A significant feature of this invention, however, is the time modulated valve 26 in combination with the sonic choked orifice 28 for controlling mass flow rate at something less than full-time sonic choked flow. Specifically, alternate closing and opening of the valve 28 is time-modulated to create a valve duty cycle that is something less than full-time open (,maximum flow set point) and something more than full-time closed (minimum flow set point). Therefore, the time-modulated valve 26 can control the effective flow rate $\dot{m}^*$ at any desired rate between the maximum set point $\dot{m}_{max}$ and the minimum set point $\dot{m}_{min}$ for any inlet plenum pressure $P_1$ and temperature $T_1$ by setting the time modulation or duty cycle of the valve 26, as will be described in more detail below.

Figure 2:
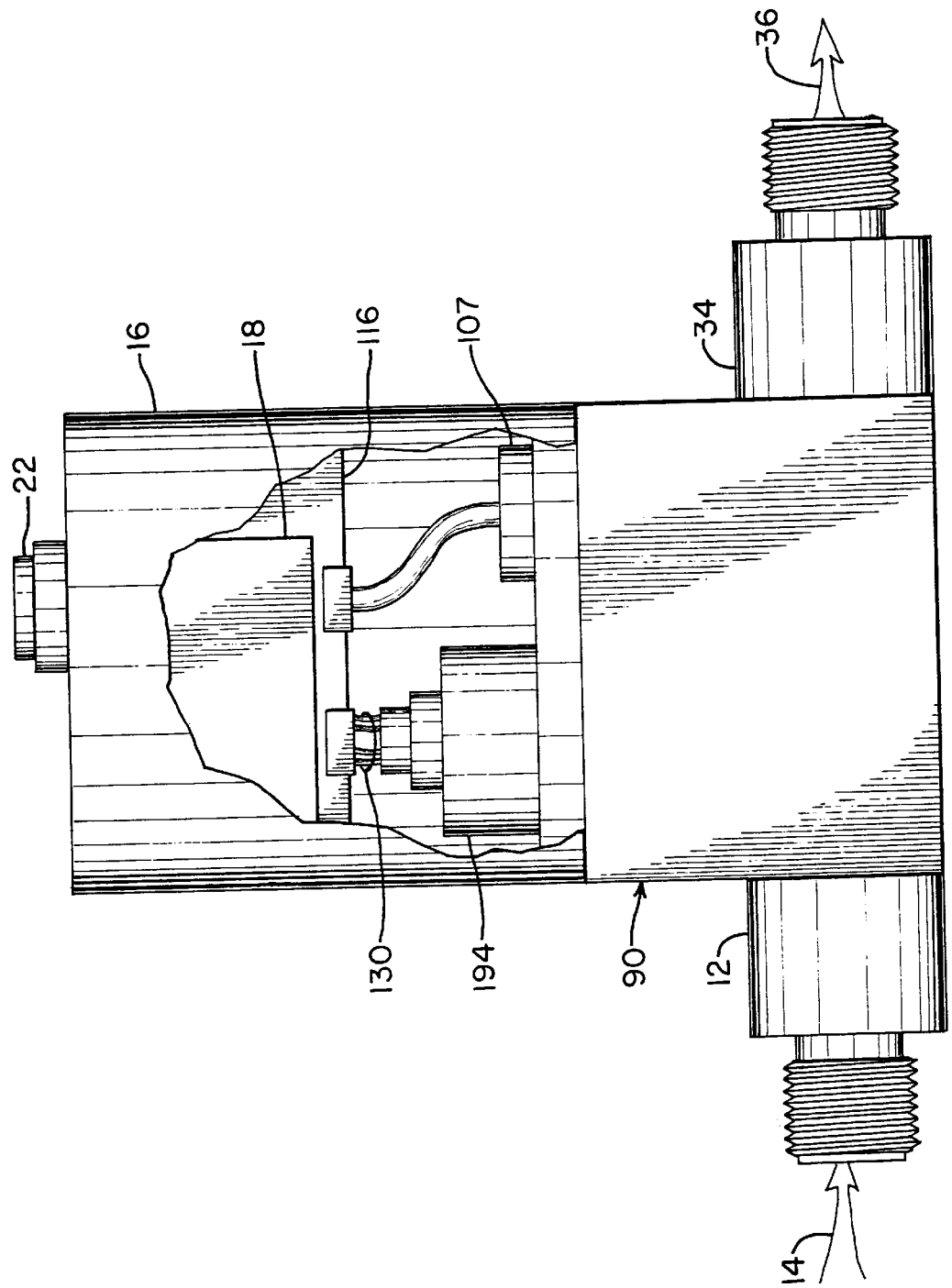
FIG. 2 is a front elevation view of the micro mass flow controller embodiment of FIG. 1.
Figure 3:
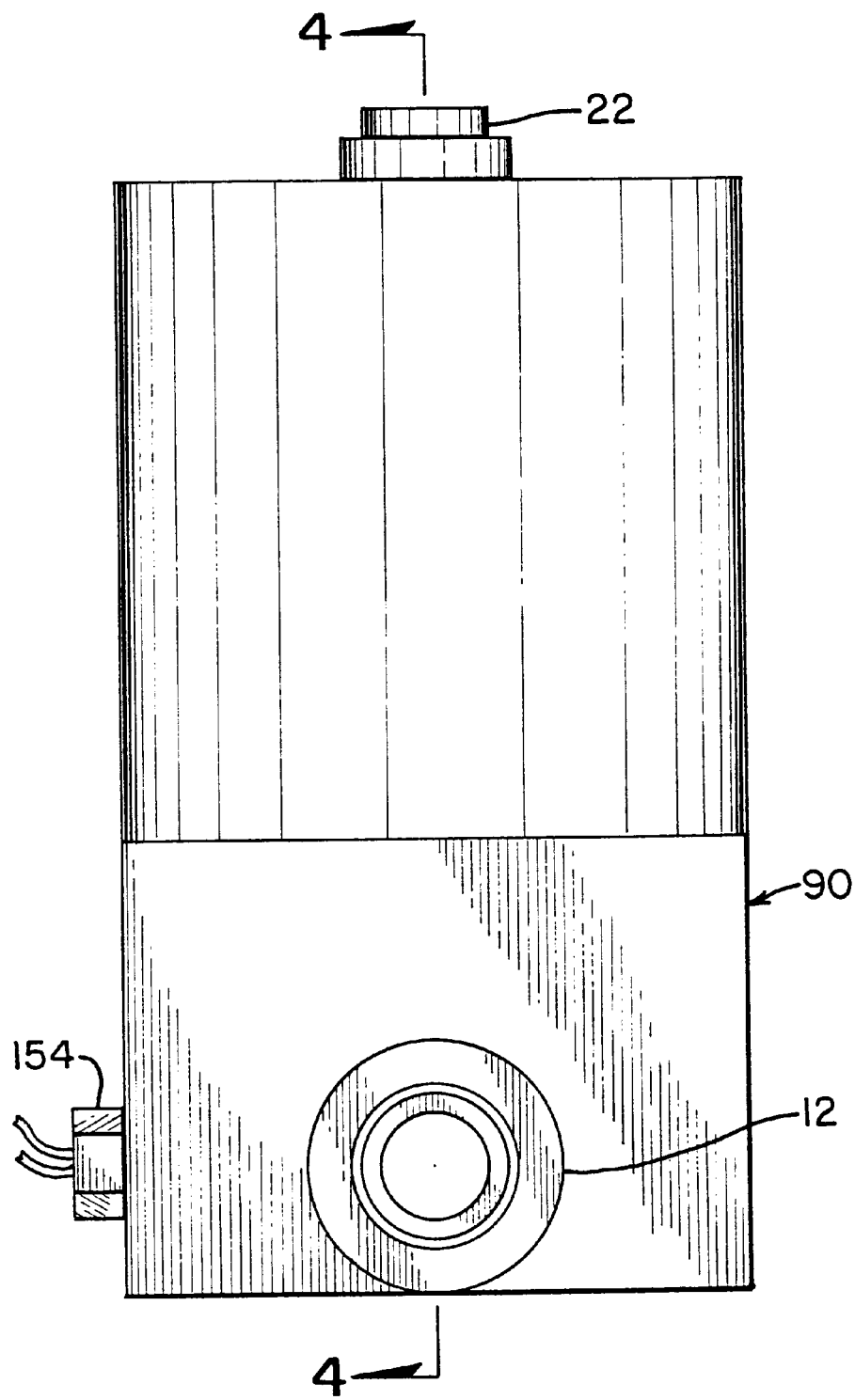
FIG. 3 is an end elevation view of the micro mass flow controller embodiment of FIG. 1; with a portion of the cover cut away to reveal components positioned under the cover
Figure 4:
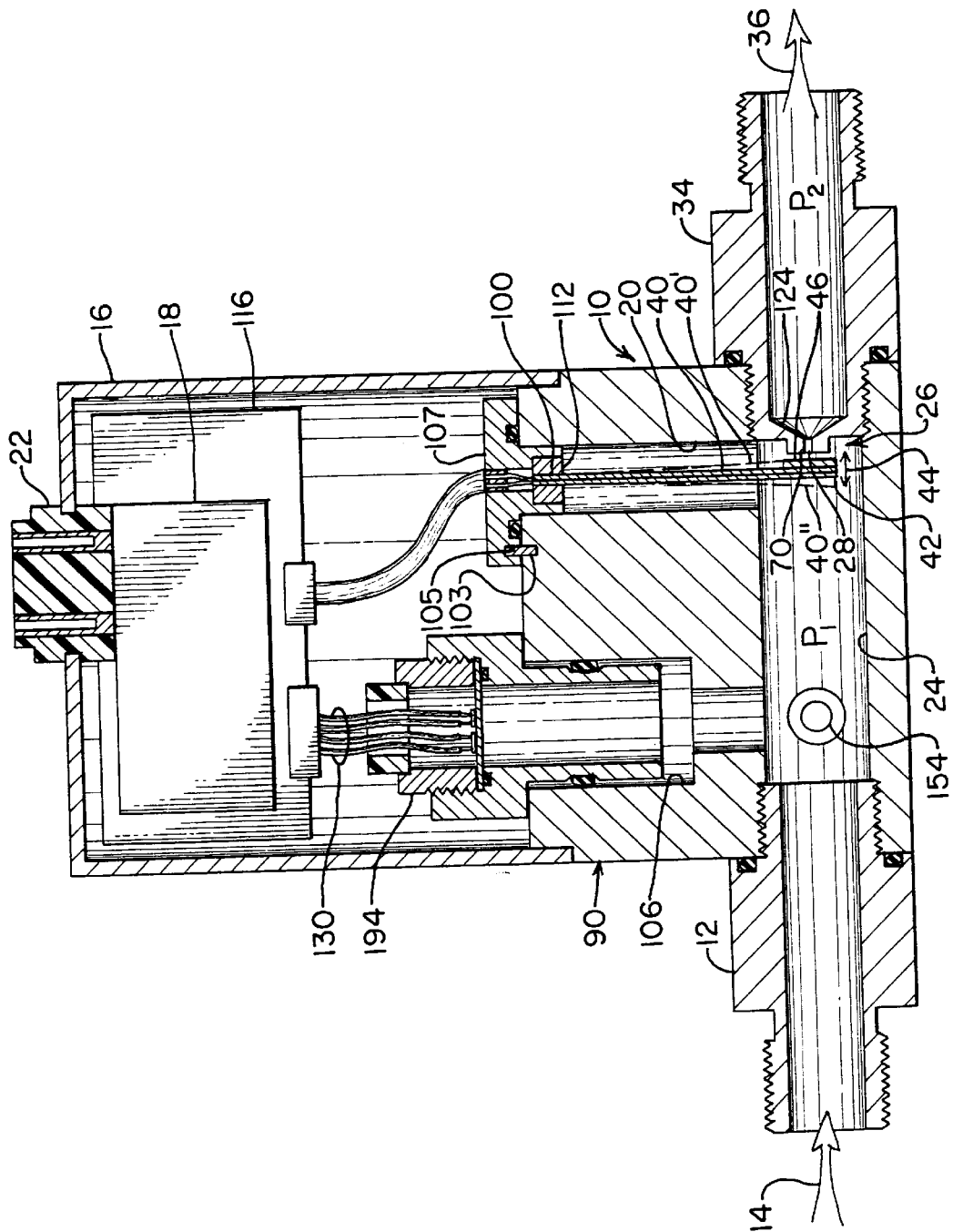
FIG. 4 is a cross-sectional view of the micro mass flow controller taken along line 4–4 of FIG. 3.

Referring now primarily to FIG. 4 along with secondary reference to FIGS. 1–3, the preferred embodiment of valve 28 comprises an elongated, laminated bender valve actuator 40 that bends forwardly as indicated by phantom line 40' when voltage of one polarity is applied and that bends rearwardly, as indicated by phantom line 40" when voltage of the opposite polarity is applied, as will be explained in more detail below. Therefore, when the voltage is alternated between the one polarity and the opposite polarity, the distal end 42 of the elongated actuator 40 oscillates back and forth, as indicated by the double-headed arrow 44. When the actuator 40 bends to the forward or closed position 40", a closure member 46 on the actuator 40 adjacent the distal end 44 occludes the orifice 28 to prevent gas flow through orifice 28, thus closing the valve 26. On the other hand, when the actuator 40 bends to the rearward or open position 40", the closure member 46 moves away from the valve bore 48, thus opening the valve 26 and allowing gas to flow through orifice 28. The open position 40" is open sufficiently such that the gas flow entering orifice 28 is not impeded or choked between the closure member 46 and the valve seat 70 before reaching the orifice 28 and so that the effective pressure at orifice 28 is substantially the stagnant plenum pressure $P_1$. When the valve 26 is opened and there is sufficient differential between the inlet plenum 24 pressure $P_1$ in front of the orifice 28 and the outlet duct pressure $P_2$ below the orifice 28, it takes only about a microsecond ($\approx 1$ μsec) for the flow to reach sonic choked condition in orifice 28. Therefore, the actuator 40 can and is preferably operated in a digital manner, snapping alternately from closed position 40' to open position 40" and from open position 40" to closed position 40'.

Figure 5:
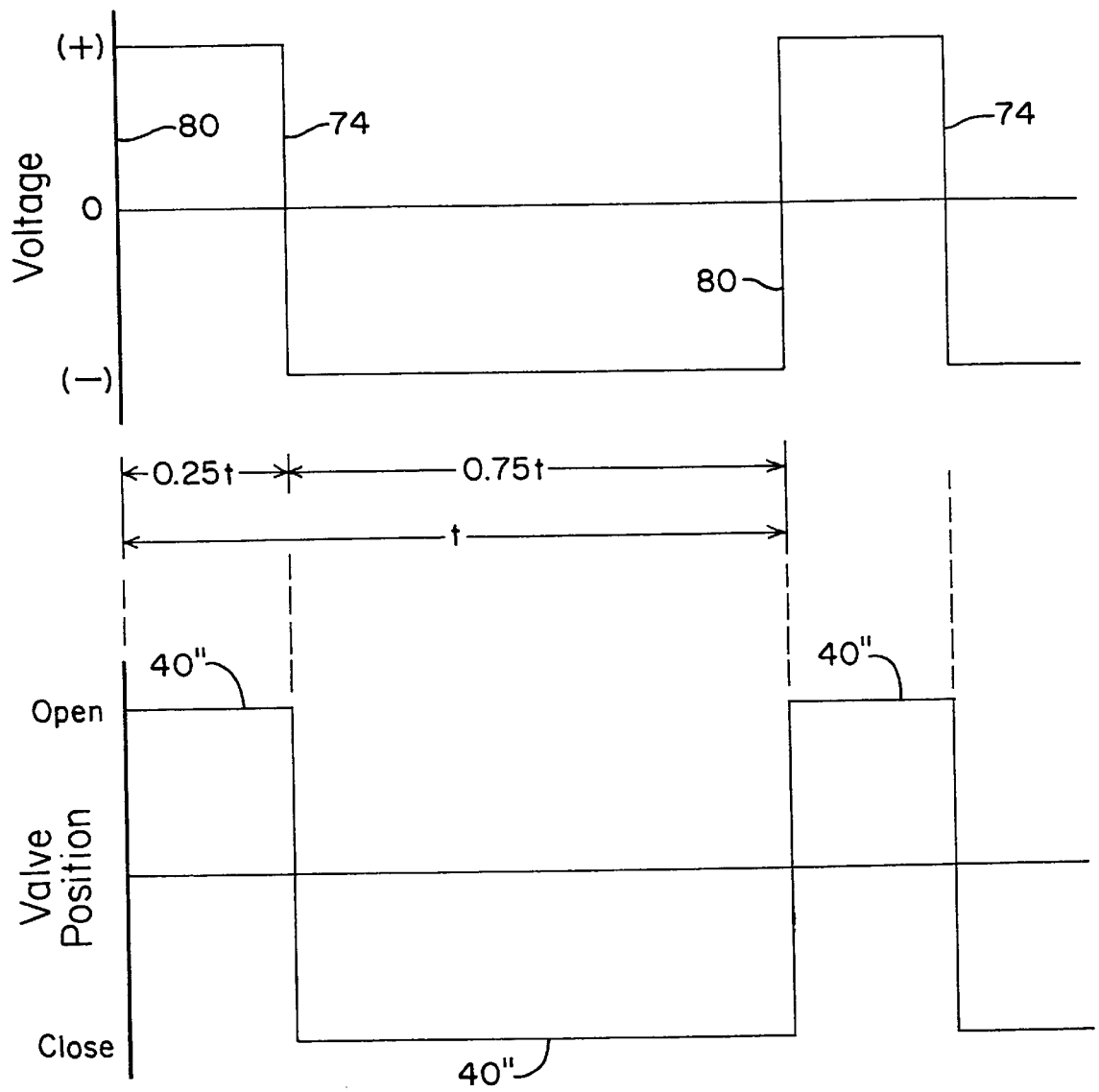
FIG. 5 is a graphical representation of an exemplary time-modulated voltage signal and duty cycle of the valve coordinated with a corresponding graphical representation of the oscillating digital valve positions.
Figure 10:
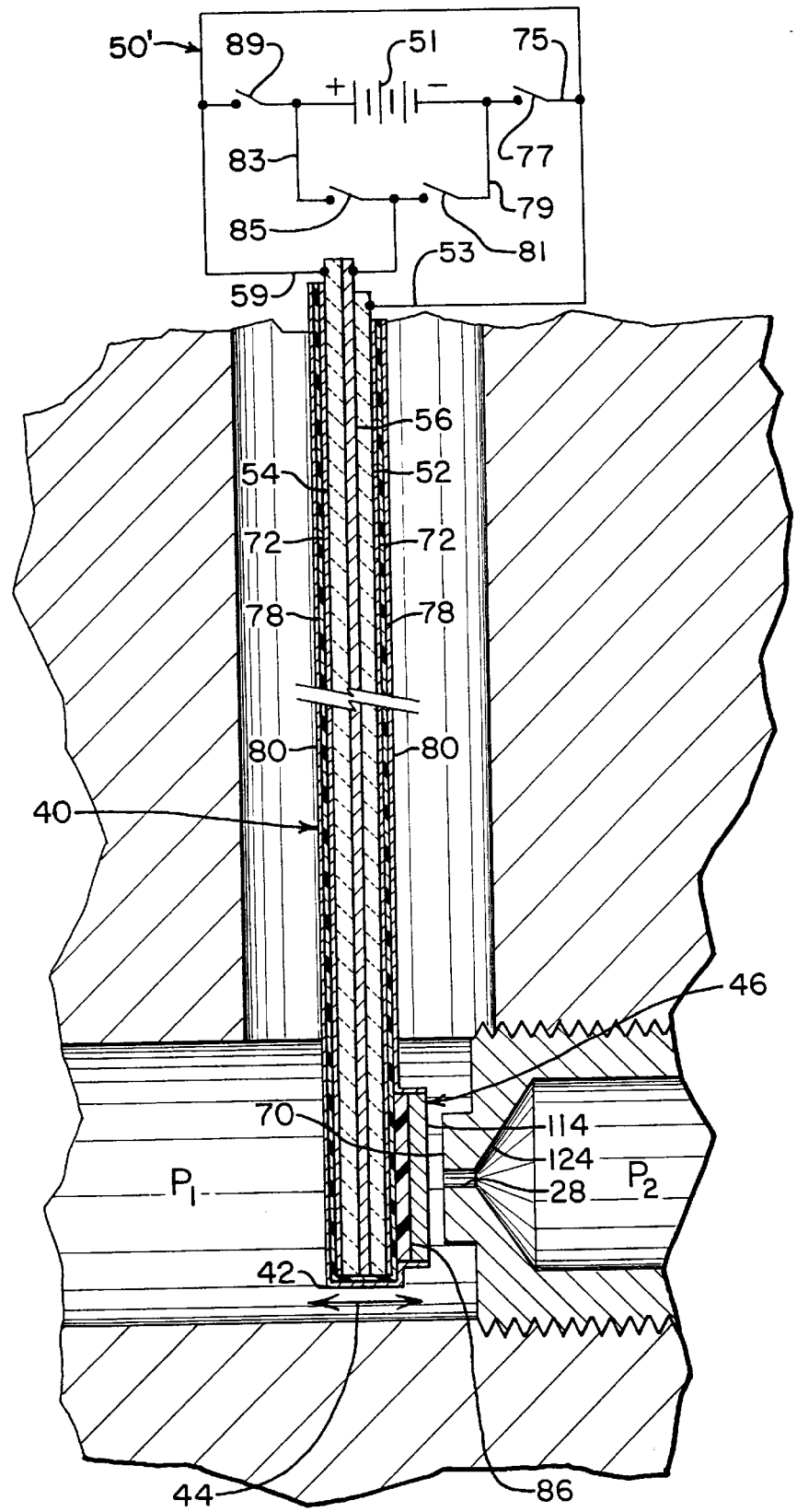
FIG. 10 is an enlarged cross-sectional view of the valve closure, valve seat, and sonic orifice of the micro mass flow controller of FIG. 1, which can also be seen in less detail in FIG. 4.

As mentioned above, the valve actuator 40 can be driven to bend rearwardly to the open position 40" by applying the opposite or second polarity voltage, and it can be driven to the closed position 40' by applying the first polarity voltage with an actuator driver circuit 50, which is shown in FIG. 10 and which will be described in more detail below. Therefore, the dwell time of the valve actuator 40 in either the closed position 40' or the open position 40" can be controlled by modulating how long the voltage on the valve actuator 40 is held to the first polarity and how long it is held to the second polarity, respectively, in each close/open oscillation cycle. For example, if, as illustrated in FIG. 5, the voltage is time-modulated to be held in the second polarity for twenty-five percent of the time t of a cycle (i.e., 0.25t) and in the first polarity for the remaining seventy-five percent of the time t of a cycle (i.e., 0.75t), the valve actuator 40 will be in the open position 40" for twenty-five percent of the time and in the closed position 40' for seventy-five percent of the time. Therefore, the valve 26, in this example, has a duty cycle of 0.25, where duty cycle is defined as the ratio of open time to total time. Since, as mentioned above, going from virtually no flow in the closed position 40' to sonic flow in the open position 40" is virtually instantaneous, requiring only about one to five microseconds (1–5 μsec), which is negligible for practical purposes, the actual mass flow rate $\dot{m}^*$ is equal to the mass flow rate m of the sonic orifice 28 according to equation (1) above multiplied by duty cycle, i.e., $$\dot{m}^*=\dot{m}\times \text{Duty Cycle.} \quad (2)$$

If, for example, the mass flow rate m through the orifice 28 for a particular gas at a particular measured inlet plenum pressure $P_1$ and temperature $T_1$ is calculated according to equation (1) to be ten standard cubic centimeters per minute (10 sccm) and the valve 26 is time modulated to have a duty cycle of 0.25, then the actual or effective mass flow rate $\dot{m}^*$ according to formula (2) above is:

$$\dot{m}^*=10\text{sccm}\times 0.25=2.5\text{sccm}.$$

Of course, for the same gas, inlet plenum pressure $P_1$ and temperature $T_1$, varying the duty cycle of the valve between zero and one would result in a linear variation of the effective mass flow rate $\dot{m}^*$ between, in this example, 0 and 10 sccm.

Also, if for some reason the pressure $P_1$ or temperature $T_1$ of the gas should change to cause a variation in mass flow rate $\dot{m}$ through the sonic orifice 28 according to equation (1) above, then duty cycle can be varied enough to compensate for such variation in the mass flow rate $\dot{m}$ to maintain a desired effective mass flow rate $\dot{m}^*$. For example, if the inlet plenum pressure $P_1$ and or temperature $T_1$ in the example above should vary enough to cause mass flow rate $\dot{m}$ through the sonic orifice 28 according to equation (1) to be 12 sccm instead of 10 sccm and it is desired to maintain the previously established effective mass flow rate $\dot{m}=2.5$ sccm, the time modulation of the voltage can be changed to achieve a duty cycle of 0.208 to maintain the effective mass flow rate $\dot{m}^*$ at 2.5 sccm. Therefore, the time-modulated controller 10 according to this invention can provide very responsive and very accurate mass flow control of gases flowing at these very low flow rates.

Figure 6:
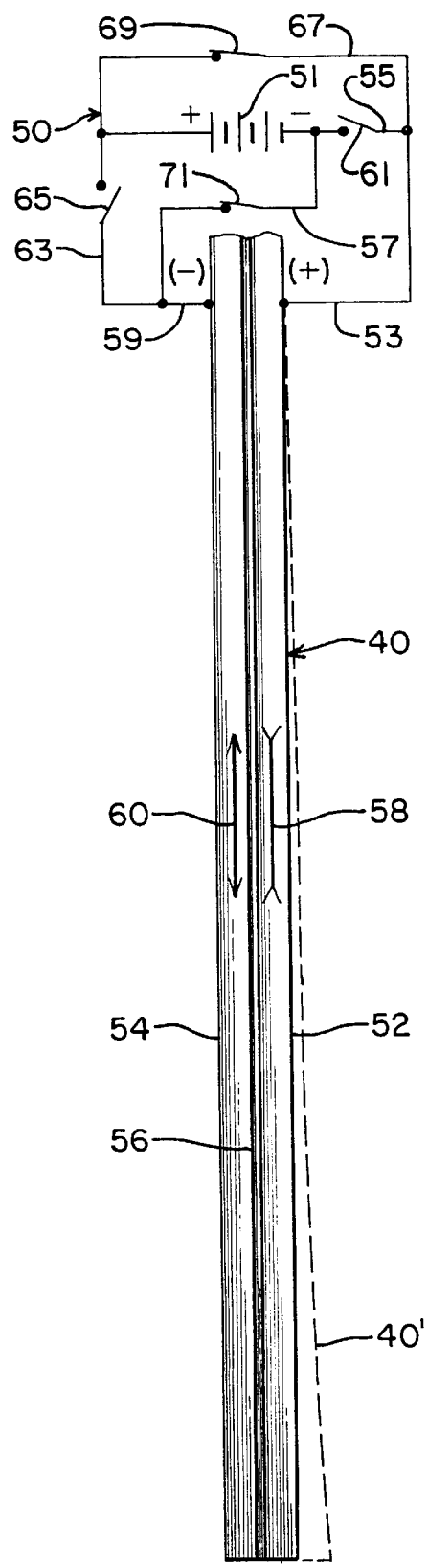
FIG. 6 is an enlarged diagrammatic elevation view of the laminated bender valve actuator components connected in series to a driver circuit illustrating how valve opening bending moments are produced.
Figure 7:
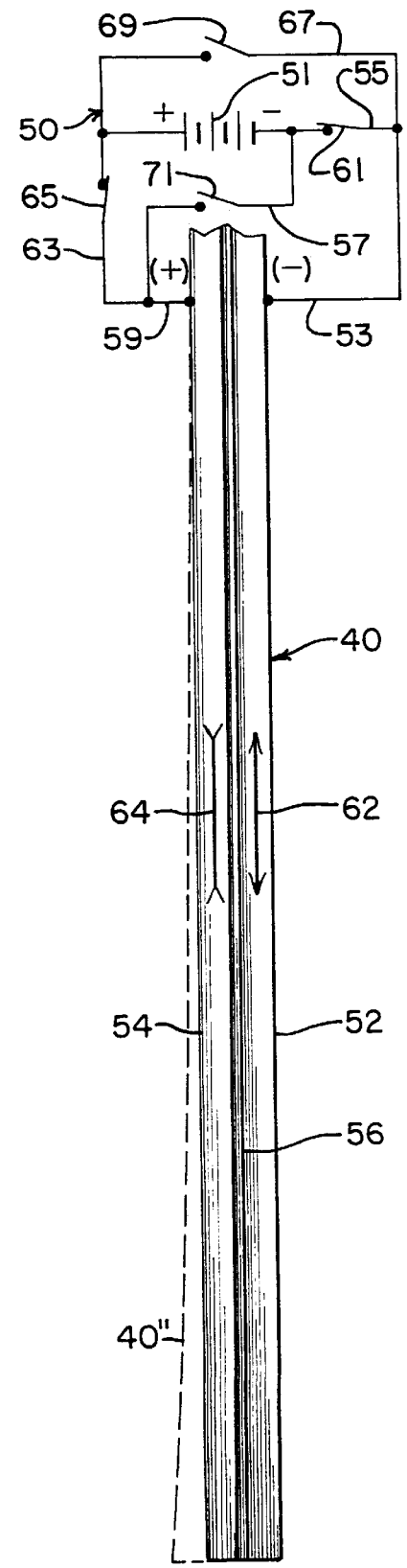
FIG. 7 is an enlarged diagrammic view of the bender valve actuator components similar to FIG. 6, but illustrating how valve closing bending moments are produced.

There are, of course, a number of actuator and driver mechanisms for modulating opening and closing the sonic flow orifice 26 and several examples will be described below, but the preferred valve closure embodiment is the laminated piezoelectric actuator 40 shown in FIGS. 1 and 4 above. For a more detailed description of the laminated piezoelectric actuator 40, reference is made to FIGS. 6 and 7. The piezoelectric actuator 40 comprises two elongated piezoelectric bender devices 52, 54 laminated together with an electrically conductive material 56, such as copper, aluminum or other metal, sandwiched between the two piezoelectric device 52, 54. Piezoelectric device have the characteristic of expanding or contracting when voltages are applied. In the actuator 40 illustrated in FIGS. 6 and 7, the piezoelectric device 52 has the characteristic of contracting in response to application of a positive voltage in the first polarity, as indicated by contraction arrows 58, while the piezoelectric bender 54 has the characteristic of expanding in response to application of a first polarity voltage as illustrated by expansion arrow 60. The result of such positive voltage, as illustrated in FIG. 6, is that the actuator 40 will tend to curl forwardly or bend to the close valve position 40'. However, when the voltage polarity is reversed to apply a voltage in the opposite or second polarity, as indicated in FIG. 7, the opposite action occurs in that the piezoelectric device 52 expands as illustrated by expansion arrow 62, while the piezoelectric device 54 contracts as illustrated by the contraction arrow 64. The result of such opposite or second polarity voltage, as illustrated in FIG. 7, is that the actuator 40 will tend to curl rearwardly or bend to the open valve position 40". Thus, the two piezoelectric devices 52, 54 together function as a bender, which can be driven electrically to oscillate between the closed valve position 40' and the open valve position 40".

In an exemplary schematic control circuit 50, a voltage source 51, preferably direct current (DC), provides the voltage. The negative terminal of the voltage source 51 is connectable to piezoelectric device 52 via a first negative circuit branch 55 connected to a first lead 53 by a switch 61 and, alternatively, to piezoelectric device 54 via a second negative circuit branch 57 connected to a second lead 59 by a switch 71. At the same time, the positive terminal of the voltage source 51 is connectable to the piezoelectric device 54 via a first positive circuit branch 63 connected to the second lead 59 by a switch 65 and, alternatively, to piezoelectric device 52 via a second positive circuit branch 67 connected to first lead 53 by a switch 69. Therefore, to bend the actuator 40 to the close position 40', as shown in FIG. 6, the first polarity can be applied by closing switches 69, 71 and opening switches 61, 65. Then, to bend the actuator 40 to the open position 40", as shown in FIG. 7, the switches 69, 71 can be opened and the switches 61, 65 closed. The switches 61, 65, 69, 71 can be transistors, relays, or any other common switch, as is well-known to persons skilled in the art, and they can be controlled by a computer or CPU, (microprocessor with appropriate interface circuitry) including open and close position dwell times to achieve the desired duty cycles and effective mass flow rates $\dot{m}^*$, as described above. Such a computer control CPU 174 is illustrated diagrammatically in the function block diagram of FIG. 12, which will be discussed below.

The metal conductor material 56 is provided between the piezoelectric devices 52, 54 to distribute the applied voltages over the lengths of the piezoelectric devices 52, 54, which are usually semiconductor materials. Elongated piezoelectric devices suitable for this valve actuator application can be obtained from Morgan Matrax, of Cincinnati, Ohio, under the trademark Bimorph™.

Figures 8, 9:
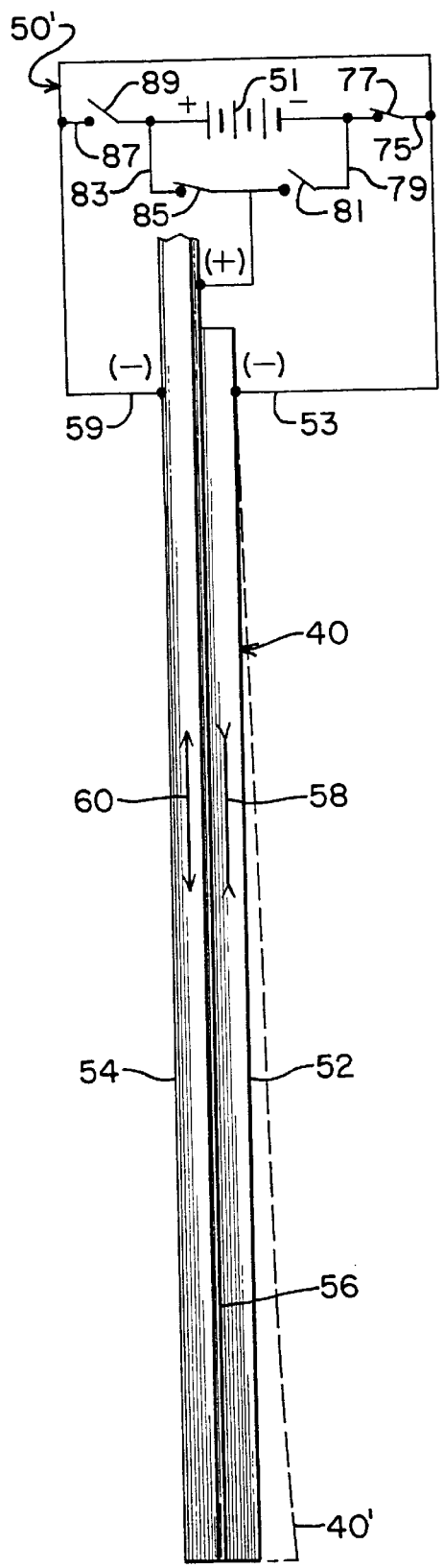
FIG. 8 is an enlarged diagrammatic elevation view of the laminated bender valve actuator components connected in parallel to a driver circuit illustrating how valve opening bending moments are produced.
FIG. 9 is an enlarged diagrammatic view of the valve actuator components similar to FIG. 8, but illustrating how valve closing bending moments are produced.

The electrical connection illustrated schematically in FIGS. 6 and 7 connects the piezoelectric devices 52, 54 in series to the driver circuit 50. Alternatively, the piezoelectric devices 52, 54 can be connected in parallel to the driver circuit 50', as illustrated in FIGS. 8 and 9 to achieve the same overall effect with less voltage, but more current required from the driver circuit 50'. In such parallel connection, in addition to a first lead 53 connected to piezoelectric device 52 and a second lead 59 connected to piezoelectric device 54, there is a third lead 73 connected to the metal layer 56. The negative terminal of the voltage source 51 is connectable to either: (i) both first and second leads 53, 59 together via a branch circuit 75 by a switch 77; or (ii) the third lead via a branch circuit 79 by a switch 81. At the same time, the positive terminal of the voltage source 51 is connectable to either: (i) the third lead via a branch circuit 83 by a switch 85; or (ii) both first and second leads 53, 59 together via a branch circuit 87 by a switch 89. Therefore, to bend the actuator 40 to the close position 40', as shown in FIG. 8, a first polarity can be applied by closing switches 77, 85 and opening switches 81, 89. Conversely, to bend the actuator 40 to the open position 40", as shown in FIG. 9, the opposite or second polarity can be applied by closing switches 81, 89 and opening switches 77, 85. Again, these switches can be controlled by a CPU 174, as shown diagrammatically in FIG. 12.

It is preferred, although not necessary, that the actuator 40 be driven from the open position 40" to the closed position 40' with a voltage that changes instantaneously from one polarity to the opposite polarity. Therefore, the driver signal voltage preferably makes the transition from one polarity to the opposite polarity virtually instantaneously as indicated by the vertical position 74 of the driver signal cycle in FIG. 5 to achieve almost instantaneous transition from the valve open position 40" to the valve close position 40'. As explained above, the valve closure member 68 only has to move off the valve seat far enough to prevent choking the gas flow between the closure member 68 and the valve seat 70 before the gas reaches the orifice 28, which, for the low pressures and mass flow rates for which the controller 10 of this invention was created, may be, for example, about 0,066. Such opening or movement of the valve closure member 68 can be accomplished almost instantaneously by the vertical portion 80 of the voltage transition signal in FIG. 5.

Sonic choked flow of the gas through the orifice 28 is required for equation (1) to be an accurate determination of mass flow rate m, as described above. To maintain sonic choked flow through an orifice, such as orifice 28 shown in FIGS. 1, 4, and 10, two conditions must be maintained. First, the ratio of stagnant pressure $P_1$ above the orifice to stagnant pressure $P_2$ below the orifice must be in the range of at least about 1.4 to 1.5 ($P_1/P_2 \geq 1.4$ to 1.5) and is preferably kept at least 2.0 ($P_1/P_2 \geq 2.0$) to assure that sonic choked flow conditions are maintained. Second, the mean free path $\lambda$ of the gas molecules must be smaller than the diameter of the orifice 28. Using helium gas as an example, for pressure as low as 3 torr, the mean free path $\lambda$ is about 0.002 inch. Therefore, a relatively large orifice 28 of at least 0.002 inch and preferably about 0.005 inch or more is very feasible for pressures in the range of about 3 psia down to 3 torr or less. Operation at higher inlet plenum pressure $P_1$ is feasible, of course, and, according to equation (1) would accommodate greater maximum mass flow rates $\dot{m}$. However, such higher pressures and flow rates diminish the ability to achieve fine and very accurate control of very low mass flow rates. Therefore, for more accurate flow control at low rate flows of less than 100 sccm and preferably even at the very low rates of in the range of, for example 0.1–10 sccm, it is desirable to operate the controller 10 of the present invention at such low inlet plenum pressures $P_1$ as 1–3 psia or less. Such low inlet plenum operating pressures $P_1$ are very feasible in feed gas applications for semiconductor reaction furnaces, which usually operate at such lower pressures, so maintaining the $P_1/P_2$ ratio of at least 2.0 as explained above is not a problem. At the same time, being able to use the relatively large orifice 28 diameter of for example about 0.005 inch has an additional advantage of being large enough to avoid most clogging problems that are encountered in current state of the art restricted orifice with bypass feedback type mass flow controllers.

Such low plenum operating pressures $P_1$ of, for example, 3 psia or less also has the advantage of minimizing leakage rate through the valve 26, when the valve closure member 46 is seated on the valve seat 70. However, another feature of this invention is the structure and method of fabricating the valve closure member 46. Specifically, as best seen in FIG. 10 along with continuing reference also to FIGS. 1 and 4, the metal layer 56 is sandwiched between the two elongated piezoelectric devices 52, 54 and fastened with an adhesive (not shown), such as epoxy to form a piezoelectric bender. The benders 52, 54 are each about 0.0075 inch thick in the exemplary embodiment. Preferably, but not necessarily, a thin layer of metal 72, such as nickel, is coated onto the surfaces of the piezoelectric devices 52, 54 to provide some corrosion protection and, more significantly, a comparable substrate for the next layer 78. The metal layer 72 can be deposited by physical vapor deposition (PVD) or by any other suitable plating process.

Then, a significant part of this invention is the combination of a dielectric layer 78 and a corrosion resistant metal layer 80 encapsulating the entire piezoelectric device structure to protect it from very reactive or corrosive gases, such as fluorine or other halogens or corrosive gases that may be metered or controlled with the micro mass flow controller 10 of this invention. The dielectric layer 78 provides electric insulation between the outer protective metal layer 80 and the piezoelectric devices 52, 54 and center metal plate or strip 56, so the electric circuits 50, 50' described above are not shorted. The dielectric layer 78 is preferably tough and stable, but also flexible and does not get brittle, so that it provides a good substrate for the outer metal protective metal layer 80, yet does not interfere significantly with vibration or oscillation of the bender or actuator 40. A preferred material for the dielectric layer is a plastic product known as Parylene™, which can be deposited in a thin layer, preferably less than 0.001 inch thick, by sputtering. Other dielectric materials, such as aluminum oxide deposited by physical vapor deposition (PVD) or chemical vapor deposition (CVD) may also be suitable for layer 78.

Stainless steel SS316 is the preferred metal for the outer cladding layer 80, because it is an accepted, industry standard, material for use with such exotic, highly reactive gases as fluorine, other halogens, and other highly reactive or corrosive gases. The SS316 stainless steel layer is preferably also kept thin enough to not add excessive mass to, or interfere significantly with, the vibrating or oscillating action of the actuator 40. A thickness of less than about 0.001 inch provides the necessary protection against highly reactive gases while meeting that criteria, and it can be deposited by sputtering, PVD, CVD, or any other suitable process. However, it is preferred, although not absolutely necessary, to mount the valve closure member 46 adjacent the distal end 42 of the actuator 40 before applying the cladding layer 80, so that the cladding layer 80 can also protect the adhesive 86 used to mount the closure member 46.

Figure 11:
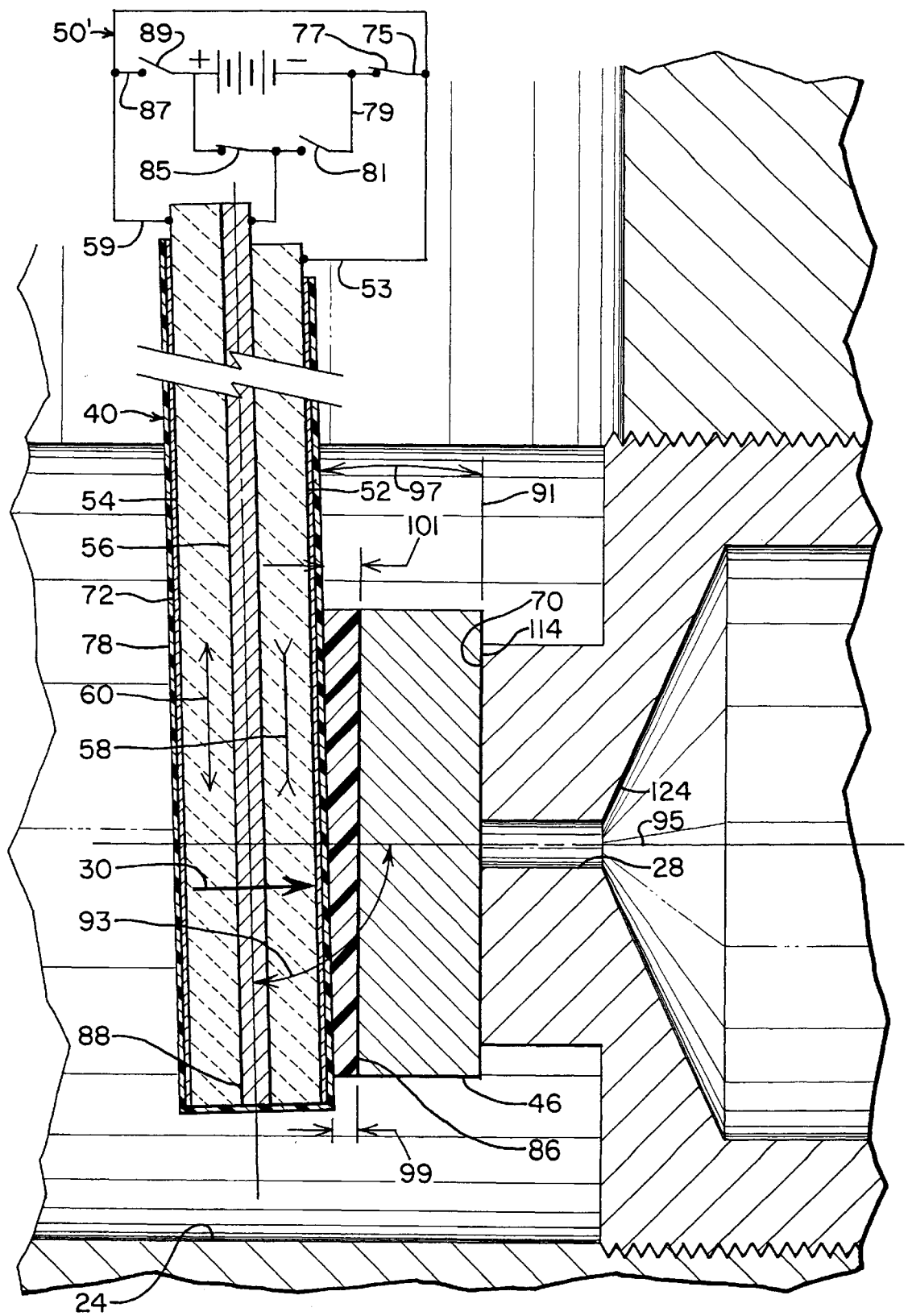
FIG. 11 is an even more enlarged cross-sectional view of the valve closure, valve seat, and sonic orifice as it is used in an intermediate fabrication stage to fit and seat the valve closure to the valve seat.

The valve seat 70 is provided by the rim surface around the opening of orifice 28. The valve closure member 46 is preferably a metal disk or wafer, for example, stainless steel, adhered to the actuator 40 by a suitable adhesive 86, such as epoxy. Both the closure disc 46 and the valve seat 70 are preferably highly polished to a flat, mirror finish. Then, the adhesive 86, preferably epoxy, is applied over the dielectric layer 78 at the location where the closure member 46 is to be mounted. Then, the polished closure member disc 46 is positioned on the uncured adhesive 86. Before the adhesive 86 dries or cures, the actuator 40 and closure member 46 are preferably mounted in the housing 16 in the exact position at which they will operate, so the polished surface 114 of the closure member disc 46 can be registered exactly on the polished surface of valve seat 70. Therefore, with the actuator 40 mounted in position, as shown in FIG. 4, a steady (not interrupted or oscillatory) voltage polarity is applied by the circuit 50 or 50', as described above to drive the bimorph actuator 40 into the closed position 40'. As best seen in FIG. 11, maintaining that voltage and polarity pushes and holds the closure member disc 46 with a force depicted by arrow 30 tightly onto the valve seat 70. Such forcing of the valve closure member 46 onto the valve seat 70 with enough force to conform the orientation of the polished surface 114 on the closure member 46 to the juxtaposed polished valve seat surface 70 around the orifice 28 by squeezing the uncured adhesive 86 and holding the force 30, until the adhesive 86 dries or cures, has the advantage of registering and keeping the surface 114 as an exact fit to the valve seat 70 for a very effective seal when the actuator 40 is in the closed position 40'. For example, as illustrated in FIG. 11, when the actuator 40 is positioned with the polished surface 114 registered on the valve seat surface 70, the longitudinal axis 88 may not be parallel to the plane 91 of the polished valve seat surface 70. Therefore, the angle 93 between the longitudinal axis 88 of the longitudinal axis 95 of the orifice 28 may be more or less than 90 degrees, and/or there may be an angle 97 greater than 0 degrees between the plane 91 and the actuator 40. However, under the closing force 30 of the actuator 40, the uncured adhesive 86 squeezed to accommodate such malalignment, as indicated in FIG. 11 where the thickness 99 of the adhesive 86 at the bottom of the closure member 46 is less than the thickness 101 at the top of closure member 46. Such variations could also be lateral or any other direction. Once the adhesive 86 cures, the orientation and spatial relationship between the closure member 46 and the actuator 40 will remain fixed. Referring to FIG. 4, a pin 103 in the body 20 and a mating hole 105 in the actuator mounting plug 107 maintains the same exact orientation of the actuator 40 to the body 20, thus to the valve seat 70 and orifice 28, whenever the actuator is installed in the body 20. Therefore, once the adhesive 86 is cured, the actuator 40 can be removed from the body 20 for encapsulating the actuator 40 with the stainless steel clodding layer 80, as described above.

The controller 10 can be constructed with any suitable housing, although one suitable embodiment is illustrated in FIGS. 1–4. The inlet plenum 24 extends through the main body section 90, and the main body section 90 also provides the structure for threaded connections of the inlet fitting 12 and outlet fitting 34 and for mounting the valve actuator 40.

The valve actuator 40 is cantilever mounted at its proximal end 100 in a retainer 112 inserted into the plug 107. Electrical connection of the actuator 40 to an electronic processor board 102 by a connector 116.

The orifice 28 can be constructed in a number of ways, although the preferred structure is shown in FIGS. 1, 4, and 10 in the form of an end wall 124 with the orifice 28 extending through the end wall 124.

The pressure measurements $P_1$ and $P_2$ can be made with conventional pressure gauges. Such a conventional pressure gauge 194 for measuring the inlet pressure $P_1$ is illustrated diagrammatically in FIG. 4 mounted in via an internal pressure connector duct 106 in the main body section 90 and connected by wires 130 to the processor board 116. Another, conventional pressure gauge (not shown) can be connected to outlet fitting 34 by a T-fitting (not shown) or other conventional manner for measuring down-stream Pressure $P_2$. Since the equation (1) for mass flow rate m in the sonic choked orifice requires absolute pressure $P_1$ as opposed to gauge pressure, another external pressure gauge (not shown) can be used to measure atmospheric pressure, which can be added algebraically to the gauge pressure detected by pressure transducer 194 to get the absolute pressure $P_1$, as is understood by persons skilled in the art or absolute pressure $P_1$ can be measured in other ways that are known and understood by persons skilled in the art.

Equation (1) also requires temperature of the gas for accurate determination of mass flow rate $\dot{m}$ through the sonic choked orifice 28. If the gas is stored at room temperature, room temperature can be assumed for purposes of the mass flow rate m calculation. However, for more accurate calculations of mass flow rate m, a thermocouple assembly 154 or any other common temperature measuring transducer can be mounted on the body section 90 to extend into the inlet plenum 24, as illustrated in FIGS. 3–4.

The controller 10, in addition to having the ability to control effective mass flow rate $\dot{m}^*$ very accurately and reliably for very small gas flow rates and at very low pressures, as described above, can also be used to meter, i.e., measure mass quantities M of gas that flows through the controller 10 over any time period. If the effective mass flow rate $\dot{m}^*$ is constant throughout the time period of interest, the mass M of the gas is simply the effective mass flow rate $\dot{m}^*$ multiplied by the time period of interest. If the effective mass flow rate $\dot{m}^*$ varies during the time period of interest, the mass M can, of course, be determined by summation of masses in numerous small time increments during the time period of interest or by integration over the time period of interest, as is understood by persons skilled in the art.

Figure 13:
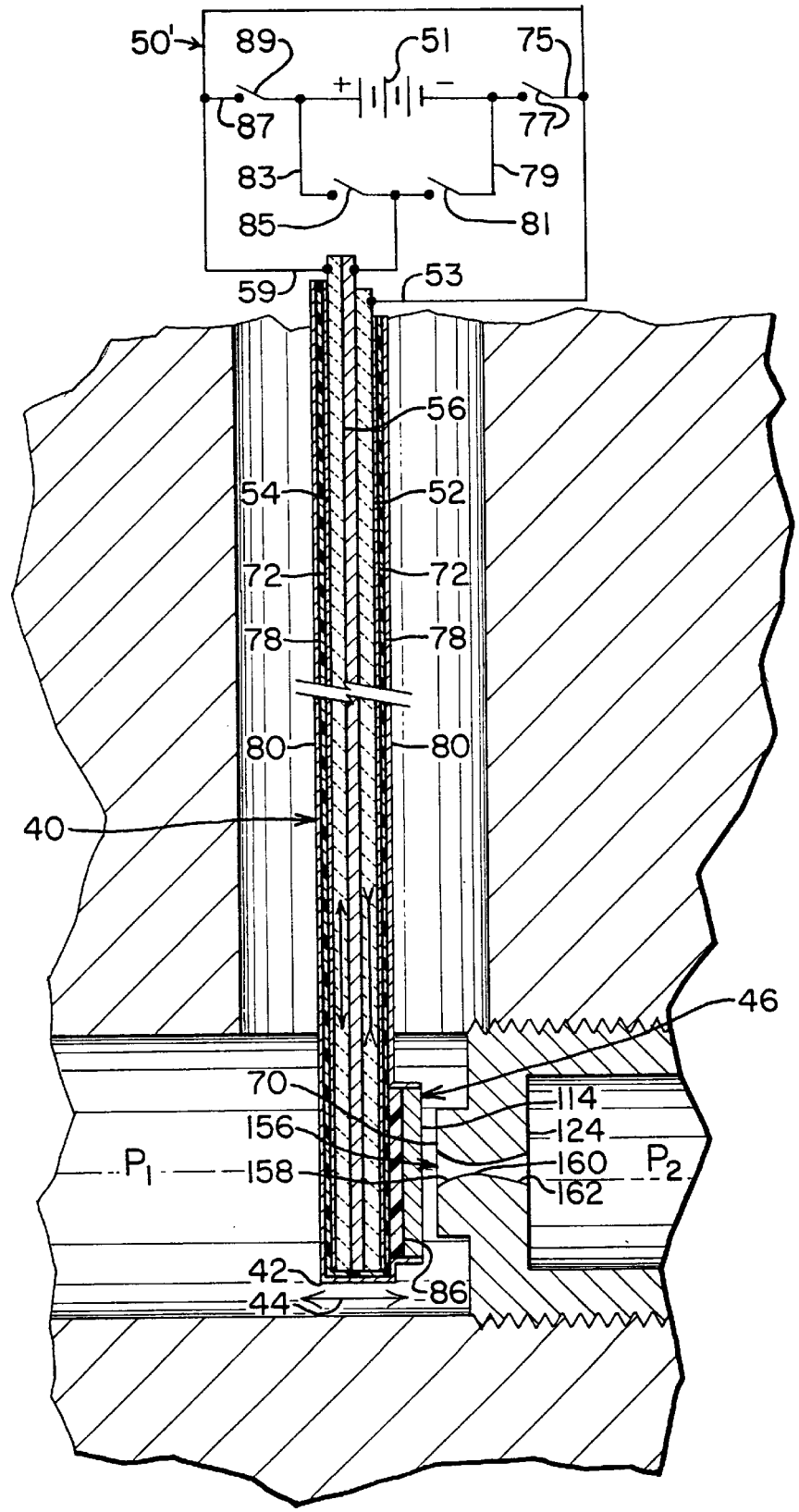
FIG. 13 is an enlarged cross-sectional view similar to FIG. 11, but with a sonic nozzle instead of a sonic orifice.

A slightly modified version of the micro mass flow controller is shown in FIG. 13 to illustrate use of a sonic nozzle 156, instead of a sonic orifice. As is understood by persons skilled in the art, a sonic nozzle has an inlet section 1 58 that converges to a throat 160 of minimum cross-sectional area and then a diverging outlet section 162. An advantage of a nozzle over an orifice is that energy is recovered in the diverging outlet section 162 so that the ratio of inlet pressure $P_1$ to outlet pressure $P_2$ needed to maintain sonic choked flow through the throat 160 can be smaller than needed to maintain sonic choked flow in an orifice. For example, a ratio of $P_1/P_2 \approx 1.15$ to 1.20 is usually sufficient to maintain sonic choked flow in a nozzle. Therefore, it may be desirable to use the nozzle 1 56 rather than the orifice 28 in situations where outlet pressure $P_2$ has to be maintained closer to available inlet pressure $P_1$ or in applications where conservation of energy is needed. In other respects, the modified controller in FIG. 13 has substantially the same components and operates in substantially the same manner as the controller 10 shown in FIGS. 1–11 and described above.

Figure 12:
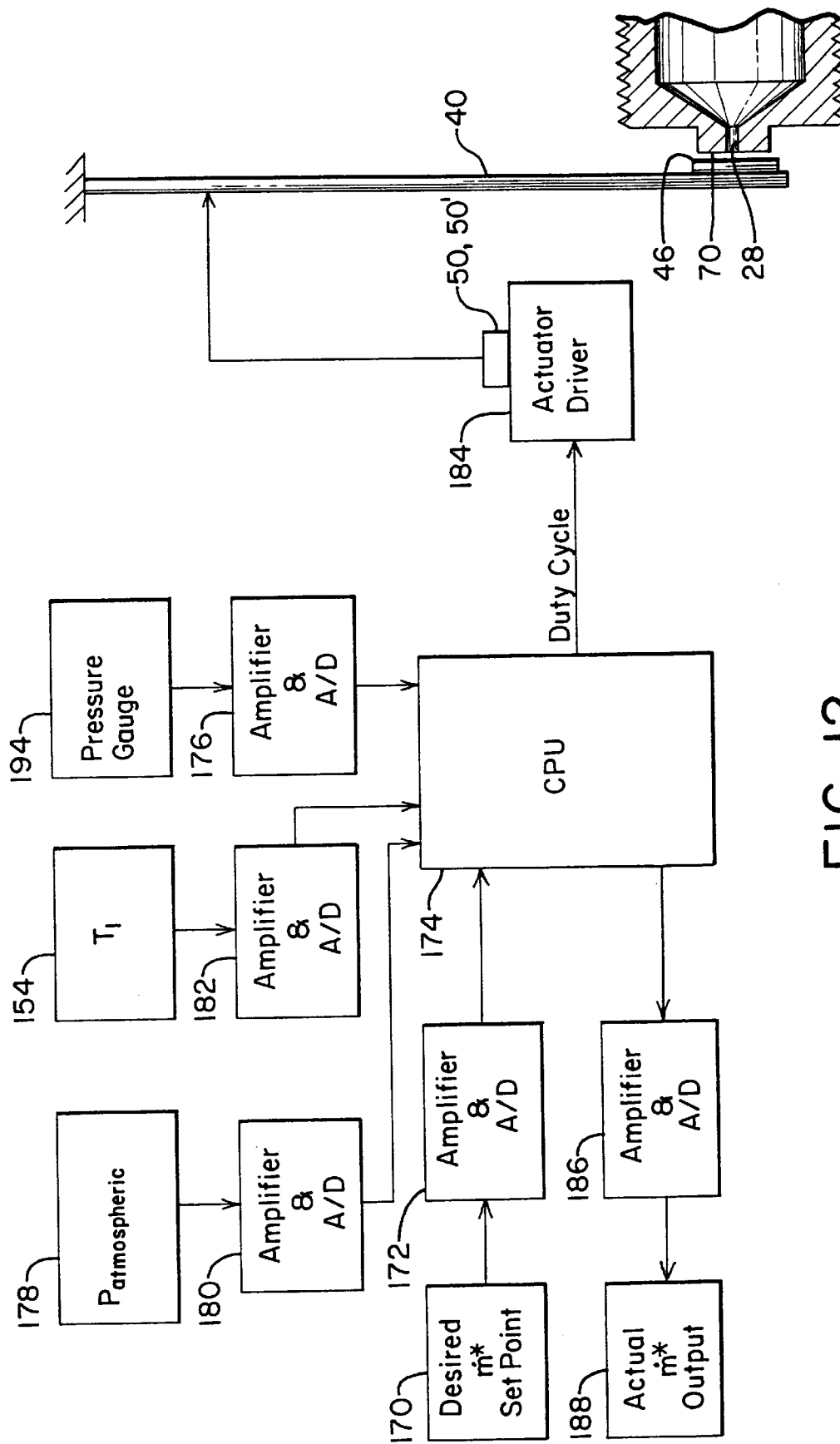
FIG. 12 is a functional block diagram of an exemplary control circuit for the controller of FIGS. 1–10.

An example, but not essential, functional block diagram of an appropriate electronic circuit for implementing the micro mass flow controller 10 according to the present invention is shown in FIG. 12. Essentially, a desired effective mass flow rate $\dot{m}^*$ set point can be provided by an analog signal, such as a voltage between 0–10 volts or a current between 4–20 ma, as shown at block 170. This set point signal is amplified and converted from analog to digital format at block 172 and delivered to a microprocessor or central processing unit (CPU) 174. Analog voltage signals from a pressure gauge 194 are amplified and converted from analog to digital format at block 176 and delivered to the CPU 174. As discussed above if, the pressure gauge 194 provides gauge pressure measurements, rather than absolute pressure $P_1$, atmospheric pressure signals from a conventional atmospheric pressure transducer 178 can be amplified and converted from analog to digital format at block 180 for delivery to the CPU 174 for use in converting such gauge pressure measurements of gauge 194 to absolute inlet plenum pressure $P_1$. If gas temperature $T_1$ input from a thermocouple 154 is used, as described above, the $T_1$ signals are amplified and converted from analog to digital format at block 182 for delivery to the CPU 174. Otherwise, an assumed room temperature or any other desired temperature correction can be programmed into the CPU 174.

As discussed above, determination of mass flow rate $\dot{m}$ by equation (1) also requires the cross-sectional area of the orifice 28, which, of course, can be figured from the orifice diameter that can be measured with any precision calipers or other well-known methods and programmed into the CPU 174. The remaining correction factor C*, as mentioned above, can be determined empirically for any gas or derived in other well-known manners for input to the CPU 174.

The CPU 174 reads all the incoming signals described above, provides the appropriate calculations and interpretations to set the duty cycle required for the desired effective mass flow rate $\dot{m}^*$, outputs the duty cycle signals to an actuator driver 184, which includes driver circuits 50, 50' or state-of-the-art functional equivalents and outputs actual effective mass flow rate $\dot{m}^*$ signals in digital format at block 188. The duty cycle signals produced by the CPU 174 can be essentially digital on/off signals of the needed time modulation for the open and close position of the controller valve 26, as described above. The duty cycle, as described above, is essentially the ratio of valve open time to total time (open time plus closed time) in a cycle, which can be determined by dividing the desired effective mass flow rate $\dot{m}^*$ by the mass flow rate in through the sonic nozzle as determined from equation (1). Thus, Duty Cycle=$\dot{m}^*/\dot{m}$.

The actual mass flow rate $\dot{m}^*$ signal that is produced by the CPU 174 can be used for any desired digital or analog display, equipment control, recording, analysis, or other function desired. In FIG. 12, it is shown going through an amplifier and digital to analog conversion at block 186 for an analog output signal representing the actual mass flow rate $\dot{m}^*$ at block 188. As also mentioned above, the metering function of the controller 10 can be implemented by summing or integrating the actual mass flow rate $\dot{m}^*$ over any desired time period. Such a metering function could be provided by the CPU 174 or by an external circuit using the $\dot{m}^*$ out put of block 188, as will be understood by persons skilled in the art.

The CPU can also be programmed to provide the other functions and calculations described above, as will be understood by persons skilled in the art. For example, the CPU 174 can also be programmed to convert temperature signals from block 154 to gas temperature $T_1$ in Kelvins as needed for use in equation (1). Of course, the CPU 174, as mentioned above, is also programmed to utilize these and other inputs to make the calculations of mass flow rate $\dot{m}$, determine duty cycle, and the like, in as many repetitions and over whatever times are desired.

The ability of the controller 10 to operate at subatmospheric pressures, for example, in the 0.25 to 3 psia range, minimizes leakage problems through the valves 26 as well as allows the use of larger orifices 28 that are less likely to clog, as discussed above. For increasing capacities or adding finer flow rate controls, multiple time-modulated, sonic choked flow valves 26 can be used together in parallel (not shown), and, if desired, all from the same inlet plenum 24, thus requiring only one pressure transducer 194 for a common inlet plenum pressure $P_1$ (in addition to an atmospheric pressure transducer, of course) for use in equation (1) for all of the multiple sonic choked orifices used. Further, each of the multiple valves could have different sized orifices and/or operate at different controlled duty cycles for precise flow rate control.

As mentioned above, it requires about 1–5 $\mu$sec. for the flow in valve 26 to go sonic, and the actuator 40 can close the valve 26 within about one microsecond, so cycle time of about one millisecond (1 msec), i.e., a frequency of for example about one kilohertz (1 KHz) is an appropriate operating range for the actuator 40, although operation at a resonant frequency should obviously be avoided. It may also be appropriate to encapsulate the actuator 40 with a different protective cladding 80, such as, for example, silicon nitride or other material when stainless steel is not required, to prevent contamination of the gas flowing through the controller 10. A turndown ratio of 400:1 is easily achievable, and over 1000:1 is likely. Response time of 30 milliseconds is within the capabilities of the controller 10, and even less response time may be achievable by limiting capacitance volumes in the valve 26. Repeatability and linearity of control measurements within 0.25% is also within the capabilities of the controller 10.

In the flow controller embodiment 10 of FIGS. 1–4, a protective cover 16 is mounted on the body 90 to cover and protect electronic components, such as a power supply board 18, the processing board 116, the pressure transducer 194 the actuator mounting plug 107, wires 130 and the like. The actuator is mounted in an internal chamber 20 in body 90, which intersect the inlet plenum 24. An electrical connector 22 extending through the cover 16 can be used for connection to external electronic power sources or output equipment (not shown).

Figure 14:
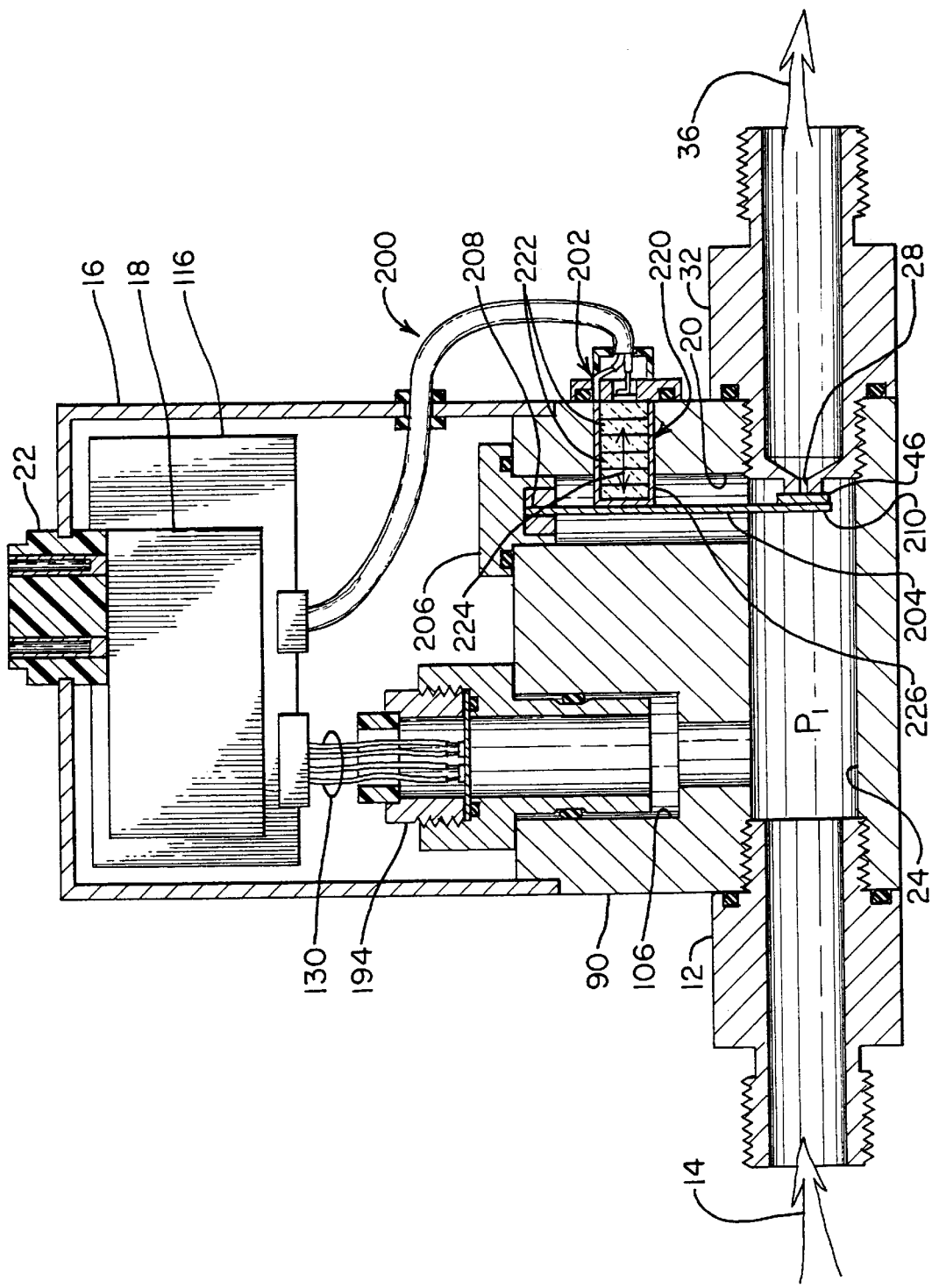
FIG. 14 is a cross-sectional view similar to FIG. 4, but showing an alternate embodiment actuator comprising a plurality of stacked piezoelectric wafers.

While the bimorph piezoelectric actuator 40 described above is the preferred valve actuator, other actuators can also be used. For example, the flow controller embodiment 200 shown in FIG. 14 has essentially the same sonic orifice 28, inlet plenum 24, and valve closure member 46, as well as most other components being the same as the embodiment 10 described above. However, the valve actuator 202 is quite different. Essentially, the valve actuator comprises an elongated leaf 204, which can be any material that is resiliently flexible, such as spring steel, plastic, composition material, or the like that has a structural memory. The leaf 204 is mounted at its proximal end 208 in a plug 206 in body 90 and extends through the chamber 20 to a position adjacent the valve seat 70 and orifice 28. The closure member 46 is mounted on the distal end 210 of the leaf 204. In this embodiment, the leaf is mounted and positioned in the plug 206 in such a manner that it is forced against the valve seat 70, and when forced away from the valve seat 70, it will spring resiliently back into contact of the closure member 46 with the valve seat 70 as soon as the force is removed, because of the resilient structural memory of the material that comprises the leaf 204. The external force to push the leaf 204 away from valve seat 70 is provided by an axial actuator driver 220 acting on leaf 204. In one embodiment axial actuator 220 shown in FIG. 14, the axial actuator 220 comprises a plurality of stacked piezoelectric wafers 222, which expand when voltage is applied with one polarity and contract when voltage is applied with the opposite polarity, as indicated by arrow 224. The piezoelectric wafers 222 are connected electrically preferably, but not necessarily, in series and are stacked in a stainless steel cylinder 226 that expands and contracts with the wafers 222. The cylinder 226 is in contact with the leaf 204. Therefore, as the wafers 222 expand, they push the leaf 204 away from valve seat 70. As the wafers 222 contract, the resilient spring memory of the leaf 204 causes it to snap back to the valve seat 70. Of course, the leaf could also be mounted away from the valve seat, and the cylinder 226 could be attached to the leaf 204 to both push and pull the leaf away from and back to the valve seat 70.

Figure 15:
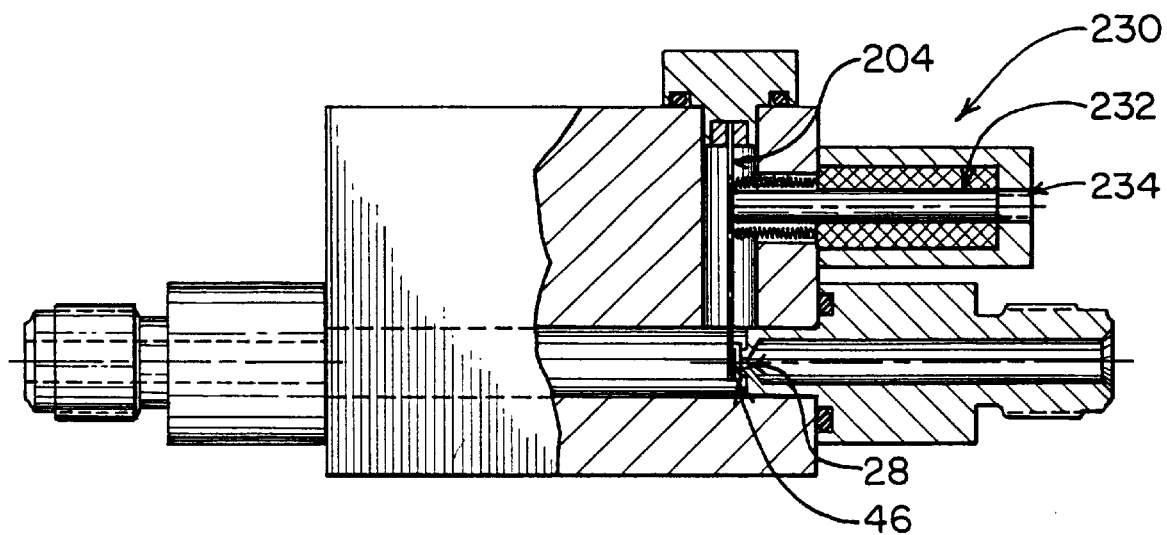
FIG. 15 is a cross-sectional view of another alternate embodiment actuator comprising a magnetostrictive rod.

Another example actuator embodiment 230 is shown in FIG. 15, the cantilevered spring leaf 204 is biased with the valve closure member 46 in the closed position over the orifice 28 and is driven away from the closed position by a magnetostrictive rod 232. An adjustment screw 234 can set motion limits on the magnetostrictive rod 232. Of course, the operation may be reversed with the spring leaf 204 set with the closure member 46 in a normally open position and the magnetostrictive rod 232 attached to pull it to the closed position.

Figure 16:
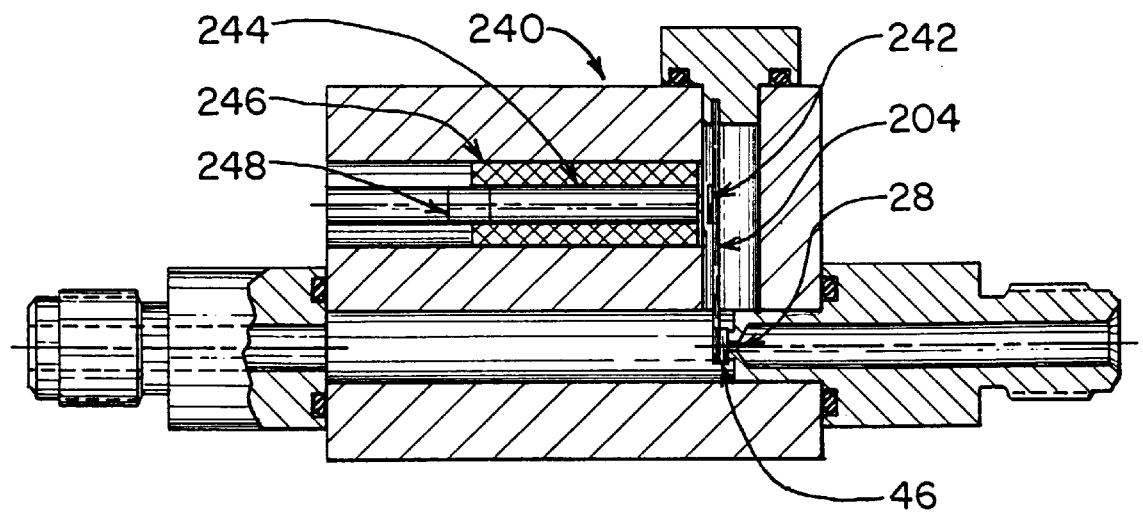
FIG. 16 is a cross-sectional view of still another alternate embodiment actuator comprising a solenoid.

Still another example actuator 240 shown in FIG. 16 has a solenoid apparatus comprising a core piece 244 pulled by a magnet coil 246. A magnetic disk on the end of the core piece 244 pulls the cantilevered spring leaf 204 and closure member 46 away from the orifice 28. A bias magnet 248 can be used to reposition the core piece 244 when voltage is removed or reversed. This embodiment 240 could, of course, also be made and used with the leaf 204 and closure member 46 in the normally open position as well as in the normally closed position.

There are, of course, many other actuators that could be used to move the closure member to and away from the valve seat and orifice without departing from the scope of this invention.

The foregoing description is considered as illustrative only of the principles of the invention. Furthermore, since numerous modifications and changes will readily occur to those skilled in the art, it is not desired to limit the invention to the exact construction and process shown as described above. Accordingly, all suitable modifications and equivalents may be resorted to falling within the scope of the invention as defined by the claims which follow.

What is claimed is:

1. Fluid flow controller apparatus, comprising:
an inlet plenum and an outlet plenum separated by a partition that has an aperture extending between said inlet plenum and said outlet plenum, said inlet plenum being connected to a source of gas that maintains gas in said inlet plenum at an inlet plenum pressure sufficiently greater than an outlet plenum pressure in said outlet plenum to cause a sonic choked flow of the gas through the aperture from the inlet plenum to the outlet plenum, and said aperture having an inlet opening from said inlet plenum and an outlet opening into said outlet plenum;

a valve positioned to open and close said aperture, said valve including: (i) a valve seat at said inlet opening; and (ii) a valve closure member that is adapted to seat on the valve seat in a manner that occludes the inlet opening, said valve closure member being mounted on an actuator that moves the valve closure member alternately between an open position in which the valve closure member does not occlude the inlet opening, which allows flow of the gas through the aperture, and a closed position in which the valve closure member seats on the valve seat and occludes the inlet opening, which prohibits flow of the gas through the aperture; said actuator including an elongated actuator arm comprising a first layer of piezoelectric material laminated with a second material, said first layer of piezoelectric material being more expansive than said second material in response to a voltage of one polarity and being more contractive than said second material in response to a voltage of an opposite polarity, and said actuator being encapsulated with a layer of metal cladding; and a controller connected to the actuator in a manner that causes the actuator to oscillate the valve back and forth between the open position and the closed position in a time-modulated cycle that sets effective mass flow rate of fluid flowing through the aperture at somewhere between a maximum set point where the valve would remain always in the open position and a minimum set point where the valve would remain always in the closed position.

2. The apparatus of claim 1, wherein said aperture includes an orifice throat restriction.

3. The apparatus of claim 2, wherein said orifice throat restriction is at said inlet opening.

4. The apparatus of claim 2, wherein said orifice throat restriction is at said outlet opening.

5. The apparatus of claim 2, wherein said orifice throat restriction is between said inlet opening and said outlet opening.

6. The apparatus of claim 1, wherein said aperture includes a nozzle between said inlet opening and said outlet opening, wherein said nozzle includes a converging section tapered radially inwardly to a restricted throat and a diverging section tapered radially outwardly from the restricted throat to the outlet opening.

7. The apparatus of claim 1, wherein said actuator includes a solenoid.

8. The apparatus of claim 1, wherein said closure member has a flat surface that is larger than said valve seat.

9. The apparatus of claim 8, wherein said closure member is a disc.

10. The apparatus of claim 1, where said second material is a second piezoelectric material that contracts when said first piezoelectric material expands and that expands when said first piezoelectric material contracts.

11. The apparatus of claim 1, including an actuator driver circuit that produces actuator driver signals of time-modulated alternating voltages of opposite polarities connected to the bender device.

12. The apparatus of claim 11, including a time modulation controller connected to the actuator driver circuit, said actuator driver circuit being responsive to said time modulation controller in a manner that produces said positive voltages and said negative voltages in duty cycles that comprise set ratios of time that the valve is in the open position to total time for the valve to oscillate through an entire cycle of open position and close position.

13. The apparatus of claim 11, wherein said time modulation controller is adjustable in a manner that adjusts the duty cycle.

14. The apparatus of claim 1, wherein said metal cladding is stainless steel.

15. The apparatus of claim 1, including a dielectric layer positioned between said bender device and said layer of metal cladding.

16. The apparatus of claim 15, wherein said dielectric layer comprises Parylene™.

17. The apparatus of claim 16, wherein said Parylene™ dielectric layer is sputter coated onto said bender device.

18. A valve actuator, comprising:
a piezoelectric device comprising at least one piezoelectric device, said device being encapsulated by a cladding material that is more corrosion resistant than said piezoelectric device.

19. The valve actuator of claim 18, wherein said cladding material comprises metal.

20. The valve actuator of claim 19, wherein said metal is stainless steel.

21. The valve actuator of claim 20, wherein said metal is stainless steel SS316.

22. The valve actuator of claim 19, including a dielectric material interposed between said piezoelectric device and said cladding material.

23. The valve actuator of claim 22, wherein said dielectric material is a plastic.

24. The valve actuator of claim 23, wherein said plastic is capable of being sputtered onto a substrate.

25. The valve actuator of claim 24, wherein said plastic is Parylene™.

26. The valve actuator of claim 22, wherein said dielectric material comprises aluminum oxide.

27. The valve actuator of claim 22, including a substrate material interposed between the piezoelectric device and the dielectric material.

28. The valve actuator of claim 27, wherein said substrate material comprises metal.

29. The valve actuator of claim 28, wherein said metal of said substrate material comprises nickel.

30. A piezoelectric actuator for use in a corrosive environment, comprising:
at least one piezoelectric device;
a metal substrate layer coated on said piezoelectric device;
a dielectric material layer coated on said metal substrate layer; and
a metal cladding coated on said dielectric layer.

31. The piezoelectric actuator of claim 30, wherein said metal substrate layer comprises nickel.

32. The piezoelectric actuator of claim 30, wherein said dielectric layer comprises plastic.

33. The piezoelectric actuator of claim 32, wherein said plastic is sputter coated onto said substrate layer.

34. The piezoelectric actuator of claim 33, wherein said dielectric layer is less than 0.001 inch thick.

35. The piezoelectric actuator of claim 33, wherein said plastic is Parylene™.

36. The piezoelectric actuator of claim 30, wherein s aid metal cladding comprises stainless steel.

37. The piezoelectric actuator of claim 36, wherein said stainless steel is SS316.

38. The piezoelectric actuator of claim 30, wherein said metal cladding is less than 0.001 inch thick.

39. A valve actuator for use in environments comprising highly reactive or corrosive gases, such as fluorine or other halogens, comprising:
a piezoelectric device comprising two elongated piezoelectric devices laminated together with a metal conductor sandwiched between the two piezoelectric devices;
a metal substrate layer coating the piezoelectric device; and
a stainless steel cladding encapsulating the piezoelectric device and metal substrate layer including a dielectric layer interposed between the stainless steel cladding and the metal substrate layer.

40. The valve actuator of claim 39, wherein the dielectric layer is less than 0.001 inch thick, and the stainless steel cladding is less than 0.001 inch thick.

41. The valve actuator of claim 39, including a valve closure member attached to said piezoelectric device with adhesive, and wherein said stainless steel cladding also covers said adhesive.

42. The valve actuator of claim 41, wherein said dielectric layer is disposed between the adhesive and the piezoelectric device.

43. A method of fabricating a valve actuator that has at least one piezoelectric device, comprising:
coating a layer of metal substrate material on the piezoelectric device;
coating a layer of dielectric material on the substrate material; and
coating a layer of metal cladding material, which is more corrosion resistant than the piezoelectric device, on the dielectric material.

44. The method of claim 43, including coating said layer of dielectric material on the substrate material by depositing plastic onto the substrate material.

45. The method of claim 44, including depositing said plastic onto the substrate material by sputtering.

46. The method of claim 44, including depositing said plastic to a thickness of less than 0.001 inch onto said substrate material.

47. The method of claim 45, wherein said plastic is Parylene™.

48. The method of claim 43, wherein said metal substrate layer comprises nickel.

49. The method of claim 43 including coating said metal cladding layer on the dielectric material by depositing stainless steel cladding onto the dielectric layer.

50. The method of claim 49, including depositing said stainless steel cladding to a thickness of less than 0.001 inch.

51. The method of claim 50, wherein said stainless steel cladding is SS316.

52. The method of claim 49, including attaching a stainless steel valve closure member onto a portion of said dielectric layer with an adhesive prior to depositing said stainless steel and then depositing the stainless steel to encapsulate the piezoelectric device, the metal substrate layer, the dielectric layer, and the adhesive with said stainless steel cladding.

* * * * *